United States Patent

Hepworth et al.

[11] Patent Number: 5,812,057
[45] Date of Patent: Sep. 22, 1998

[54] DEVICE FOR FINDING CONCEALED STUDS

[75] Inventors: Paul Steabben Hepworth, Guildford; Brian Edward Brooks, Burton-on-Trent; Paul Hatcher, Godalming, all of United Kingdom

[73] Assignee: Turner Intellectual Property Ltd., Staffordshire, United Kingdom

[21] Appl. No.: 702,661

[22] PCT Filed: Mar. 7, 1995

[86] PCT No.: PCT/GB95/00489

§ 371 Date: Oct. 31, 1996

§ 102(e) Date: Oct. 31, 1996

[87] PCT Pub. No.: WO95/24660

PCT Pub. Date: Sep. 14, 1995

[30] Foreign Application Priority Data

Mar. 8, 1994 [GB] United Kingdom .................. 9404416

[51] Int. Cl.$^6$ ................................................. G05B 21/00
[52] U.S. Cl. ...................... 340/540; 307/116; 324/71.1; 324/658; 340/692
[58] Field of Search ...................... 340/540, 692, 340/674; 307/116, 125; 324/658, 679, 71.1

[56] References Cited

U.S. PATENT DOCUMENTS 4,191,894   3/1980   Noda et al. ............................ 307/116

FOREIGN PATENT DOCUMENTS

2 159 630   12/1985   United Kingdom .

*Primary Examiner*—Glen Swann
*Attorney, Agent, or Firm*—Thomason & Moser

[57] ABSTRACT

A detector device for finding concealed studs in partitioning includes a pair of plates which are supplied with ac via resistors. Amplifiers produce outputs representing the sum and difference respectively of the signals imposed on the plates. The sum signal drives a display enabling circuit including a comparator which enables a display means to operate when the sum signal exceeds a threshold level. The difference signal drives two comparators which control three display device such that one display device is operated only when the detector device is over the center of a stud. The other display devices indicate which way the detector should be moved to place it over the center of the stud.

13 Claims, 8 Drawing Sheets

DEVICE FOR FINDING CONCEALED STUDS

BACKGROUND OF THE DISCLOSURE

This invention relates to a device for finding concealed studs in hollow partitions and the like.

Stud finding devices utilising capacitive detectors are already known, e.g. from GB-B-2159630. The device described in that document makes use of a capacitor plate to which an oscillator output is applied. The device is moved over a partition containing studs and provides a display dependent on the effective capacitance of the capacitor plate. An automatic self calibrating arrangement is employed to allow the device to be set up over a part of the partition where there is no underlying stud.

The known device has the disadvantage that it is not easy to use it to find the centre of a concealed stud. The display indicates that the capacitance rises relatively rapidly as the capacitor plate starts to overlap the stud and remains at a maximum level over a considerable area. It is thus necessary for the user to note the limits of the maximum capacitance area and estimate its centre.

SUMMARY OF THE INVENTION

It is an object of the present invention to provide a device which makes finding of the centre of a concealed stud relatively simple.

In accordance with the invention there is provided a device for detecting the position of a stud in a partition comprising first and second substantially coplanar side-by-side capacitor plates which are electrically isolated from one another, means for applying an alternating signal to said plates through first and second impedance means respectively, so as to produce on said plates alternating voltage signals of amplitude related to the capacitance of each plate, means for producing a first electrical signal related to the sum of such alternating voltage signals, means for producing a second electrical signal related to the difference between such alternating voltage signals and display means including display enabling means operable in accordance with said first electrical signal and balance indicating means operable in accordance with said second electrical signal.

The display means may include three display devices operating when the display is enabled to indicate respectively (a) when the first capacitor plate has a significantly higher capacitance than the second, (b) when the capacitances of the two plates are substantially equal and (c) when capacitance of the second plate is significantly higher than that of the first.

The three display devices, which may be light emitting diodes, are preferably arranged to indicate the direction in which the device must be moved to achieve balance.

The device preferably has a self-calibrating arrangement arranged to establish a threshold level for the sum signal and a balance level for the difference signal during initial operation of the device.

BRIEF DESCRIPTION OF THE DRAWINGS

An example of the invention is shown in the accompanying drawings in which.

DETAILED DESCRIPTION

Figure 1:
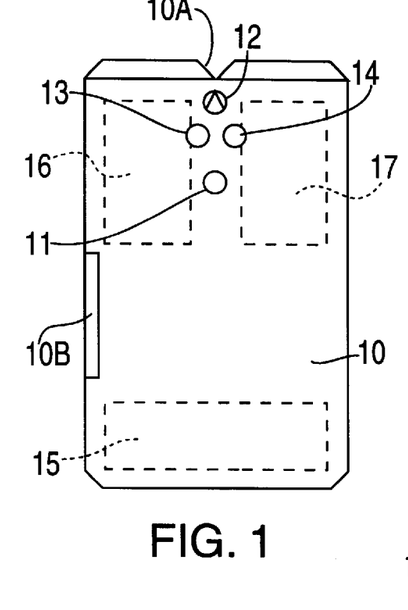
FIG. 1 is an elevation of a device in accordance with the invention.

Referring to FIG. 1, the device shown has a case 10 with a switch operating element $10^b$ mounted on it at one side. In the front face of the case 10, there are mounted four light emitting diodes 11, 12, 13 and 14 in a diamond shaped layout, one of these leds 12 being green and triangularly shaped. One vertex of the triangle is directed towards a notch $10^a$ in the end of the case. The remaining leds are red.

Contained within the casing is an operating circuit which includes a battery 15 and a pair of rectangular, coplanar capacitor plates 16, 17, formed as areas of a printed circuit board (not shown). This board lies close to the back face of the casing.

Figure 2:
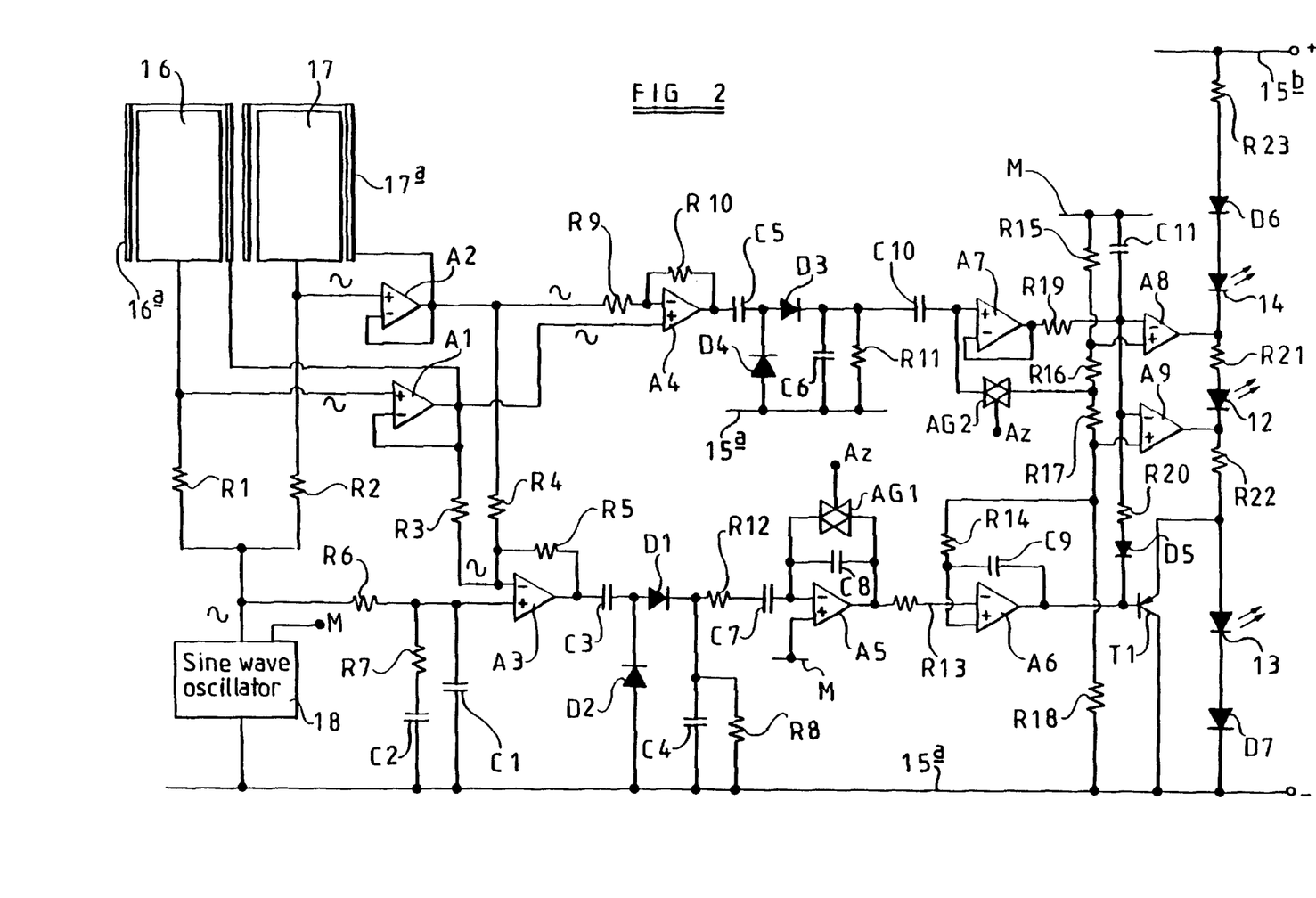
FIG. 2 is a circuit diagram of the device.

Turning now to FIG. 2 it will be seen that plates 16 and 17 are connected by respective ones of two resistors $R_1$ and $R_2$ to the output terminal of a sine wave oscillator 18. A pair of buffer amplifiers $A_1$ and $A_2$ have their non-inverting inputs connected to the respective plates 16 and 17. Each amplifier $A_1$ and $A_2$ has a direct feedback connection from its output to its inverting input. Each capacitor plate 16, 17, is substantially surrounded by a printed circuit track $16^a$, $17^b$ and these are connected respectively to the outputs of the two amplifiers $A_1$ and $A_2$ so that these two tracks are maintained at the same voltage as the respective capacitor plates, but are driven from the low impedance outputs of the amplifiers, rather than through the high impedance paths provided by the resistors $R_1$ and $R_2$.

The buffer amplifiers $A_1$, $A_2$ provide signals determined by the voltages on the two plates 16, 17 both to a summing amplifier $A_3$ and to a difference amplifier $A_4$. Two resistors $R_3$ and $R_4$ connect the outputs of amplifiers $A_1$ and $A_2$ to the inverting input of amplifier $A_3$, negative feedback around amplifier $A_3$ being provided by a resistor $R_5$. The resistance values are chosen to provide a gain of 5 of each input signal. The non-inverting input of amplifier $A_3$ is connected by a resistor $R_6$ to the output of the oscillator 18 and by a capacitor $C_1$ connected in parallel with the series combination of a resistor $R_7$ and another capacitor $C_2$ to the battery negative rail $15^a$. The components $R_6$, $R_7$, $C_2$ and $C_1$ are chosen to provide a signal corresponding to the sum of the outputs of amplifiers $A_1$ and $A_2$ when the device is operated in free space.

The output of amplifier $A_3$ is connected to a rectifying circuit comprising an input capacitor $C_3$ connected to the anode of a diode $D_1$ and the cathode of a diode $D_2$. The anode of diode $D_2$ is connected to the rail $15^a$ and the cathode of diode $D_1$ is connected by a capacitor $C_4$ to rail $15^a$. A resistor $R_8$ is connected across the capacitor $C_4$. Capacitor $C_4$ has a capacitance of about 10 times that of capacitor $C_3$ so that the rectifier acts as a diode pump to charge up capacitor $C_4$ to a peak voltage related to the amplitude of the sum signal at the output of amplifier $A_3$, charge being allowed to leak away through resistor $R_8$ when the amplitude falls.

The difference amplifier $A_4$ has its non-inverting input connected to the output of buffer amplifier $A_1$ and its inverting input connected by a resistor $R_9$ to the output of buffer amplifier $A_2$. Negative feedback is provided by a resistor $R_{10}$, of ohmic value chosen to give a gain of 10. A rectifying circuit similar to the one described above is connected to the output of amplifier $A_4$. This rectifier circuit comprises diodes $D_3$ and $D_4$, capacitors $C_5$ and $C_6$ and a resistor $R_{11}$. The diode $D_4$, the capacitor $C_6$ and the resistor $R_{11}$ are connected to the rail $15^a$.

The output of the sum signal rectifying circuit, taken from the cathode of diode $D_1$, is connected via a resistor $R_{12}$ and a capacitor $C_7$ in series to the inverting input of an operational amplifier $A_5$ which has negative feedback provided by a capacitor $C_8$ and which has its non-inverting input connected to a regulated voltage rail M. A CMOS analog gate element $AG_1$ is connected in parallel with the capacitor $C_8$ for discharging capacitor $C_8$ and providing direct boot strapping of amplifier $A_5$ during automatic self-calibration as will be hereinafter described.

The output of amplifier $A_5$ is connected by a resistor $R_{13}$ to the inverting input of another operation amplifier $A_6$. This has its non-inverting input connected by a resistor $R_{14}$ to a point on a voltage divider chain $R_{15}$, $R_{16}$, $R_{17}$ and $R_{18}$ connected between the rail M and the rail $15^a$. Positive feedback around amplifier $A_6$ is provided by a capacitor $C_9$.

The output of the difference signal rectifying circuit, taken from the cathode of the diode $D_3$ is connected by a capacitor $C_{10}$ to the non-inverting input of another operational amplifier $A_7$ connected as a voltage follower. Another analog gate $AG_2$ connects another point on the voltage divider chain to the non-inverting input of amplifier $A_7$ for self-calibration.

The resistor chain $R_{15}$ . . . $R_{18}$ has relatively high ohmic value resistors $R_{15}$ and $R_{18}$ at opposite ends and two relatively low ohmic value resistors $R_{16}$, $R_{17}$ in between. The common point of resistors $R_{15}$ and $R_{16}$ is connected to the non-inverting input of an operational amplifier $A_8$ and the common point of resistors $R_{17}$ and $R_{18}$ is connected to the non-inverting input of an operational amplifier $A_9$. The common point of resistors $R_{16}$ and $R_{17}$ is connected to analog gate $AG_2$. The inverting inputs of amplifiers $A_8$ and $A_9$ are connected to one another, to the output of amplifier $A_7$ by a resistor $R_{19}$, to the rail M by a capacitor $C_{11}$ and to the output of amplifier $A_6$ by a resistor $R_{20}$ and a diode $D_5$ in series. The latter connection ensures that the outputs of amplifiers $A_8$ and $A_9$ (which act as voltage comparators) both go high when the output of amplifier $A_6$ goes low irrespective of the output of amplifier $A_7$.

The green triangular led 12 is connected in series with a resistor $R_{21}$ between the outputs of amplifiers $A_8$ and $A_9$. The LED 13 has its anode connected by a resistor $R_{22}$ to the output of amplifier $A_9$ and its cathode connected by a diode $D_7$ to the rail $15^a$. The LED 14 is connected in series with a diode $D_6$ and a resistor $R_{23}$ between the positive battery rail $15^b$ and the output of amplifier $A_8$.

The circuit shown in FIG. 2 is completed by a pnp transistor $T_1$ which has its base connected to the output of amplifier $A_6$ and its collector-emitter connected across LED 13 and diode $D_7$.

Figure 4:
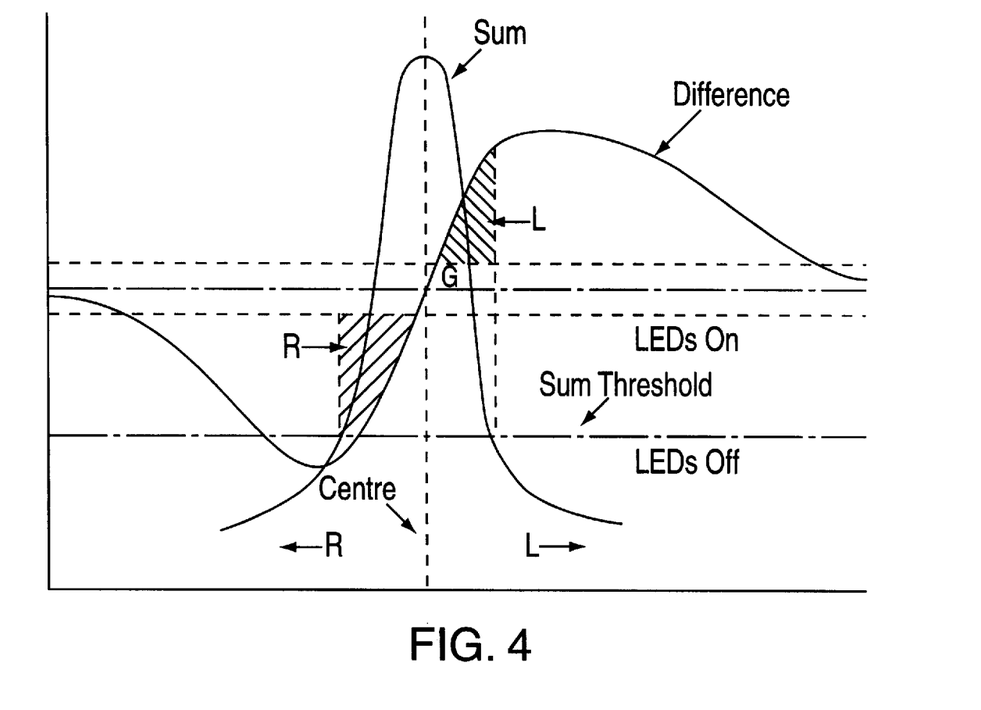
FIG. 4 is a graph showing voltage signals produced in the circuit of FIG. 2 and their variation with the position of the device relative to a detected stud.

FIG. 4 is a graph showing voltage signals produced in the circuit of FIG. 2 and their variation with the position of the device relative to a detected stud. Specifically, FIG. 4 shows the summing (Sum) and difference (Difference) signals produced by, respectively, the sum signal rectifying circuit at the cathode of diode $D_1$, and the output of difference amplifier $A_4$. When the device is positioned at a center point (Centre) of a stud, the summing (Sum) signal is at a maximum level and the difference (Difference) signal is at a median level. As the device is moved away from the center point (Centre) of the stud, the summing (Sum) signal approaches a minimum level and the difference (Difference) signal approaches a positive (device moving left) or negative (device moving right) maximum level before returning to the median level. Shaded portions of FIG. 4 are used to indicate that the device is positioned either to the right of R or to the left of the center point (Centre) of the stud. The shaded portions, R and L, are bounded by a summing signal threshold level (Sum Threshold). Thus, the device will produce positional indications when the summing signal (Sum) level is above the summing signal threshold level (Sum Threshold).

Figure 3:
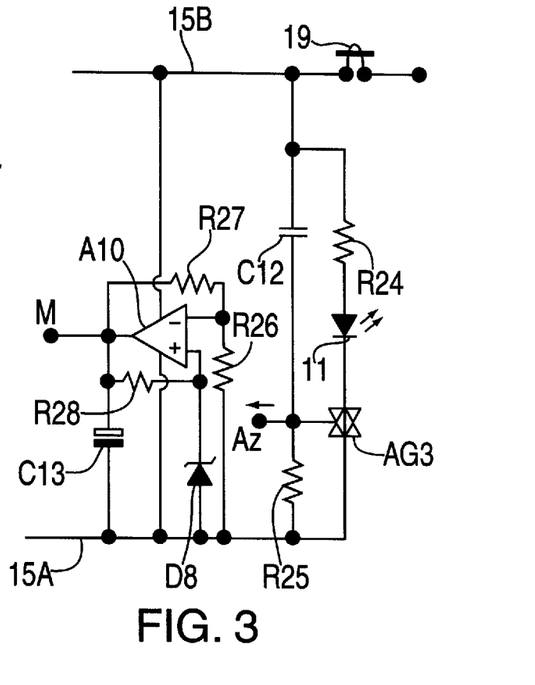
FIG. 3 is a circuit diagram of a switch-on pulse circuit and a voltage regulator forming part of the device.

FIG. 3 shows a switch 19 which is operated by the element $10^b$ and which connects the rail $15^b$ to the battery positive terminal. FIG. 3 also shows a start up pulse circuit including an analog gate device $AG_3$. Device $AG_3$ is connected at one side to rail $15^a$ and at the other side by a resistor $R_{24}$ to rail $15^b$ an LED 11 being included in the series circuit. Device $AG_3$ has its control terminal connected by a resistor $R_{25}$ to rail $15^a$ and by a capacitor $C_{12}$ to rail $15^b$ so that it is switched on only while capacitor $C_{12}$ is charging up following closing of switch 19. The LED 11 remains on when the device $AG_3$ is conducting.

FIG. 3 includes an operational amplifier $A_{10}$ which has its non-inverting input connected to the rail $15^a$ by a 3v zener diode $D_8$. The inverting input of amplifier $A_{10}$ is connected to rail $15^a$ by a resistor $R_{26}$. Negative feedback is provided by a resistor $R_{27}$ and a resistor $R_{28}$ connected between the output of amplifier $A_{10}$ and the cathode of the zener diode $D_8$ provides current to the latter. A smoothing capacitor $C_{13}$ is connected between the output of amplifier $A_{10}$ and rail $15^a$.

In operation, the device is held against a partition to be tested and the switch 19 is closed. The oscillator and all the operational amplifiers are powered up immediately and gates $AG_1$ and $AG_2$ are both turned on. This causes the non-inverting input of amplifier $A_7$ to be held at a specific voltage for a period so that capacitor $C_{10}$ charges to a voltage determined by the difference voltage signal. Similarly capacitor $C_7$ charges to a voltage determined by the sum signal voltage. Throughout the continuing operation (i.e. for a few seconds) capacitors $C_{10}$ and $C_7$ hold these voltages, thereby providing the required automatic self calibration operation.

On termination of the power on pulse, the sum and difference voltage signals vary in dependence on the dielectric constants of material over which the plates 16 and 17 lie, as the device is moved along the partition surface. When a stud in the partition is encountered, the amplitude of the alternating voltage on the first plate to encounter the stud starts to rise first. This causes the sum voltage to rise and the difference voltage to rise or fall depending on which plate has encountered the stud. Whilst the sum voltage is below a threshold value, the output of amplifier $A_6$ is low, thereby turning on transistor $T_1$ and causing the outputs of both amplifiers $A_8$ and $A_9$ to go high, ensuring that none of the leds is lit. When the sum rises above this threshold value amplifier $A_6$ output goes high. At this stage the outputs of both amplifiers $A_8$ and $A_9$ will be the same, either high or low depending on which plate has encountered the stud first. Thus either led 13 or led 14 is lit. As the balance point is approached, the output voltage of amplifier $A_7$ enters the narrow band of voltages over which it lies between the voltages on the non-inverting inputs of amplifiers $A_8$ and $A_9$. Thus green led 12 alone is lit. As movement continues, the $A_7$ output voltage again goes outside the narrow band causing the other of leds 13 or 14 to be lit.

When the green led is on, the partition may be marked by means of a pencil in notch $10^a$ to indicate the stud centre.

Figure 5:
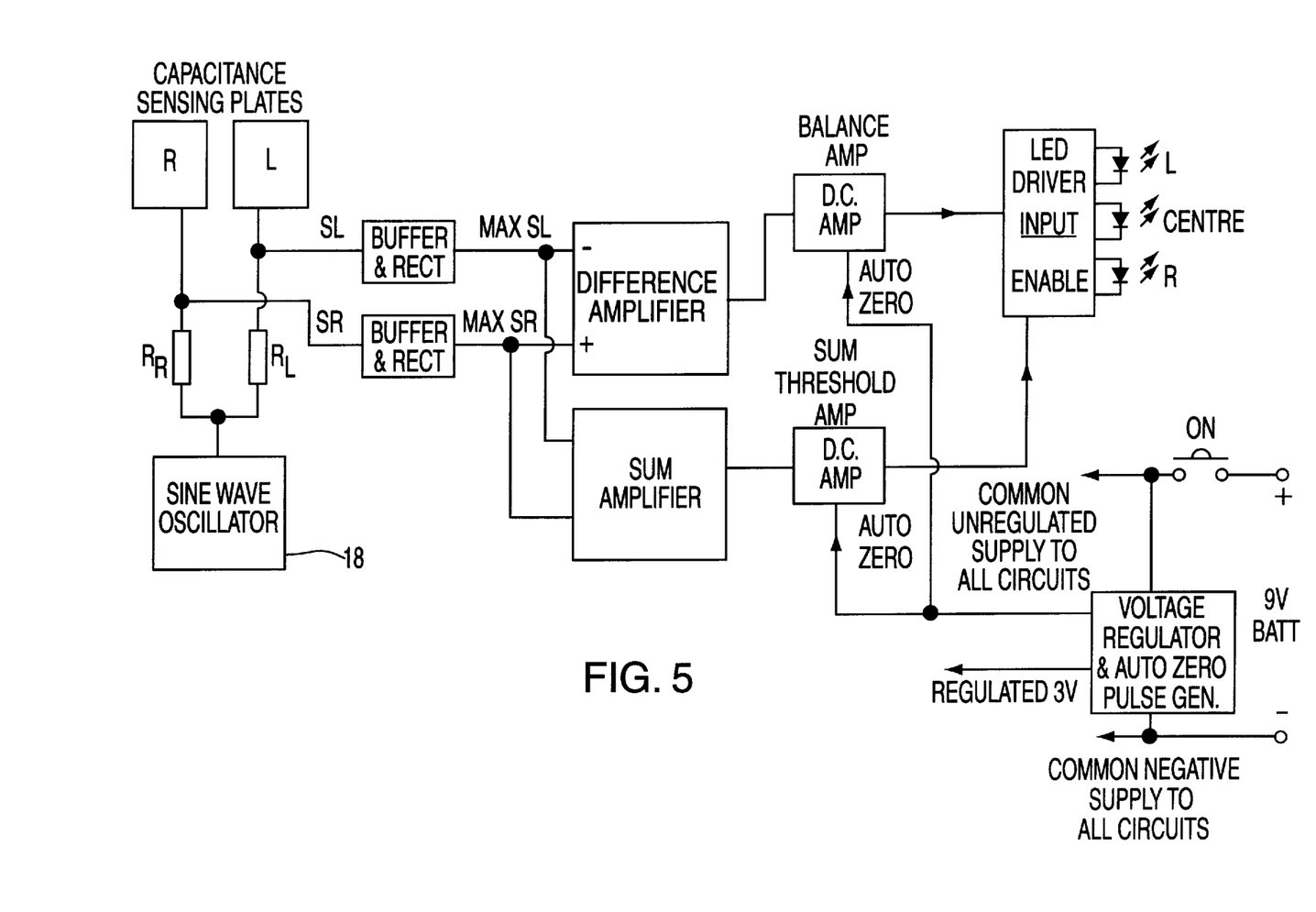
FIG. 5 is a block diagram for a device in accordance with a second embodiment of the invention.
Figure 6:
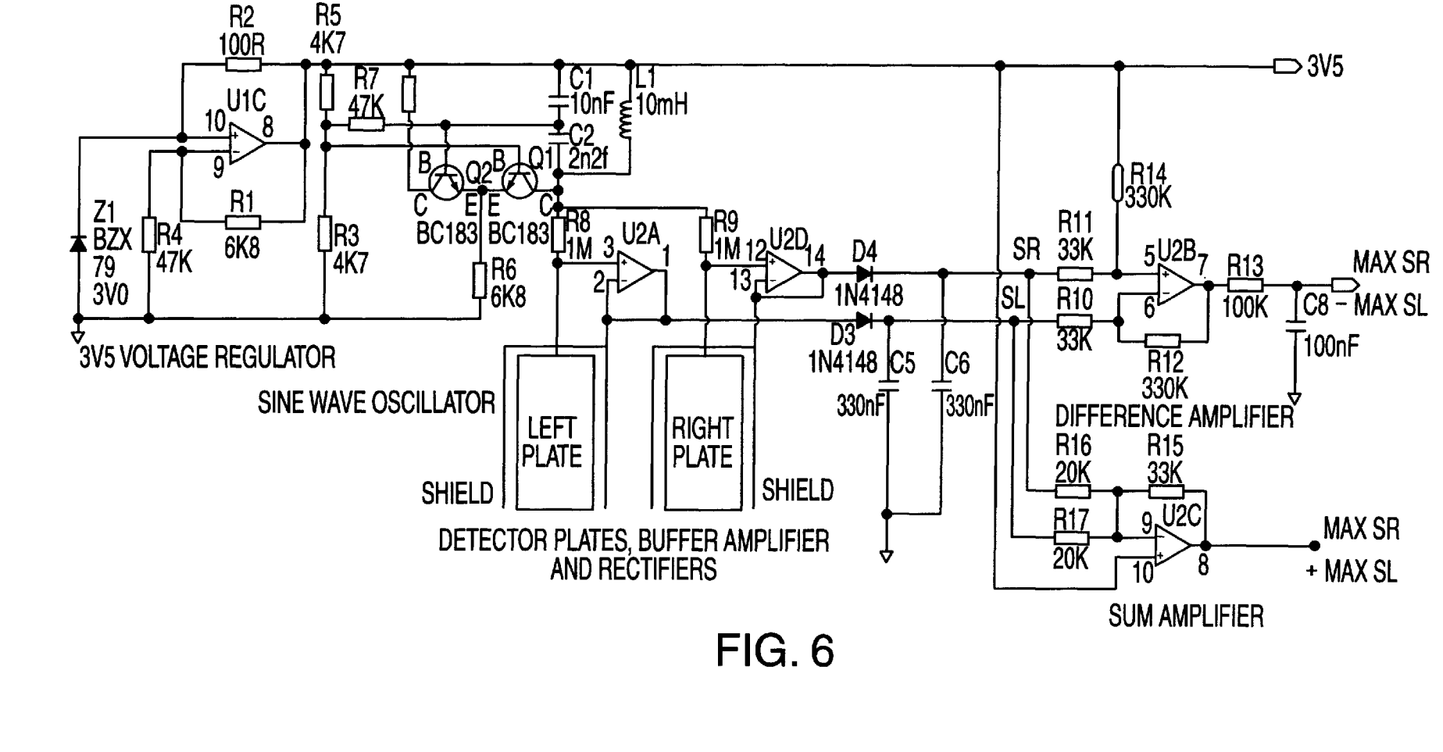
FIGS. 6 and 7 are two halves of a circuit diagram corresponding to the block diagram of FIG. 5.
Figure 7:
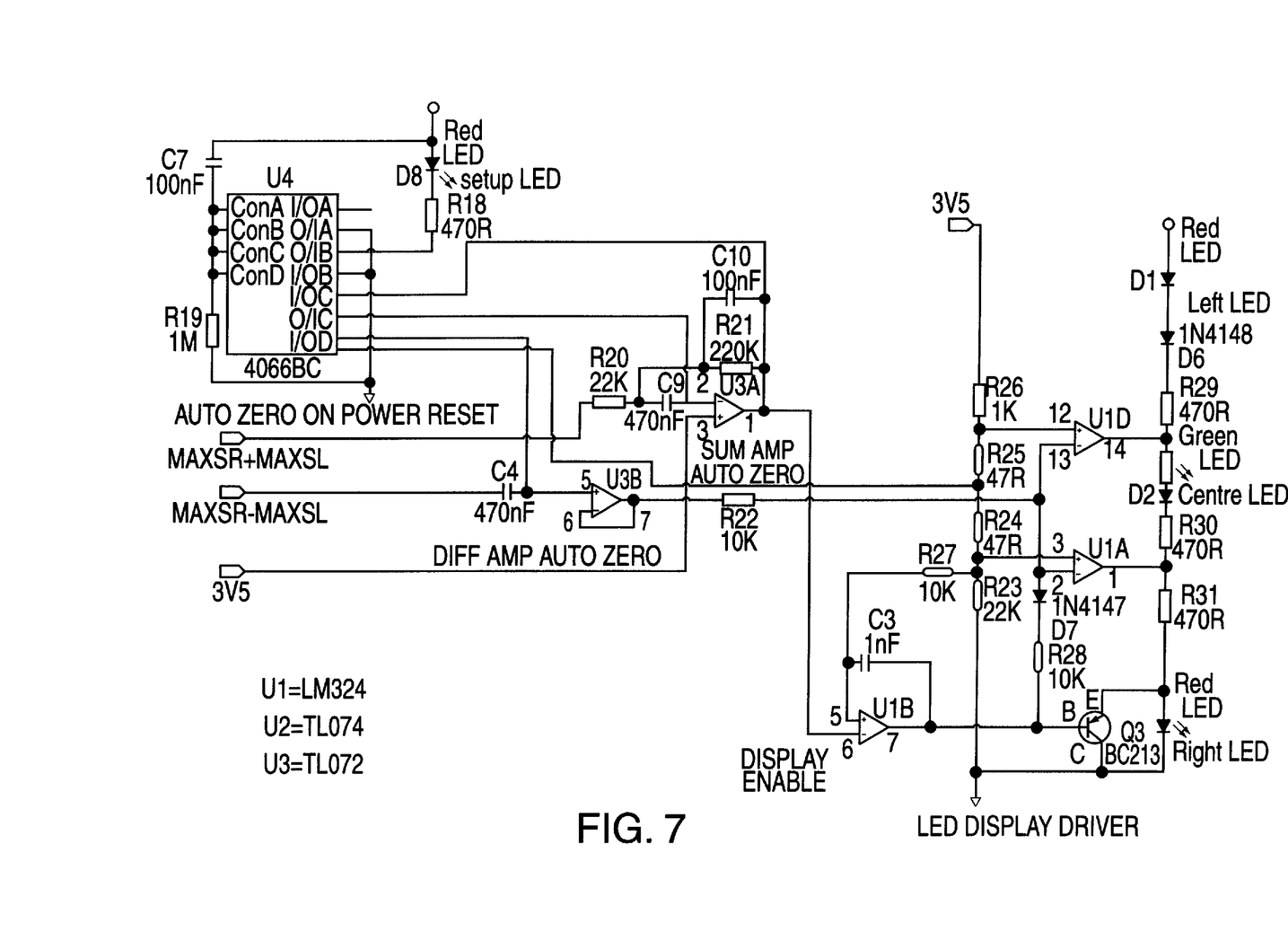

With reference to FIGS. 5, 6 and 7 the sine wave oscillator 18 is a Colpitts type oscillator which is formed by transistors $Q_1$ and $Q_2$ and the associated components including capacitors $C_1$ and $C_2$ and inductor $L_1$ which determine the frequency of oscillation. Power is supplied to the oscillator by means of a voltage regulator which is based upon integrated circuit UIC and, zener diode Z1, and associated resistors R1–R7.

As in the example of FIG. 2, the detector plates are supplied with the sine wave signal from the oscillator by way of resistors $R_8$ and $R_9$ respectively and associated with the plates and the associated shields, are FET input buffer amplifiers U2A and U2D. The outputs of the amplifiers are connected to peak detection circuits each formed by a diode and a capacitor, D3, C5 and D4, C6, respectively. The signals at the points SL and SR in FIG. 6 are therefore the peak levels of the signals from the respective plates minus the diode volt drop.

The signals at the points SL and SR are applied to a difference amplifier U2B and a summing amplifier U2C. The summing amplifier has associated feedback resistor R15 and summing resistors R16 and R17. The difference amplifier has associated close tolerance resistors R10, R11, R12 and R14 having values such that the gain is 10. If there is any error in the resistor values common mode signals will appear at the output and a low pass filter formed by resistor R13 and capacitor C8 is provided. The filter has a −3 dB cut off at 15.9 Hz.

FIG. 7 shows the portion of the circuit which is concerned with the display and reset and is coupled to the portion of the circuit shown in FIG. 6 by the connections indicated at the right hand of FIG. 6 and the left hand of FIG. 7.

The calibration stage acts to eliminate any offset in the outputs of the sum and difference amplifiers U2C and U2B. The stage utilizes a quad CMOS switch U4 which is provided with an RC circuit formed by capacitor C7 and resistor R19. At switch on the capacitor is discharged so that inputs CONA-COND are at logic "1" and all the CMOS switches are closed. As the capacitor is charged the voltage applied to the input falls and eventually the inputs reach logic "o" so that the switch is switched off. A series connected LED D8 and a resistor R18 are coupled between the charging voltage and ground via one of the CMOS switches of U4.

The difference amplifier output may have an offset and this is effectively removed by the action of capacitor C4 and U3B which has a high impedance FET input. This input is shorted by the action of the CMOS switch to the junction of R24 and R25 forming part of the LED display driver. Any offset is therefore removed and when the CMOS switch is turned off the input of U3B is free to respond to the output of the difference amplifier. The output of U3B is coupled to the LED display driver by resistor R22.

The summing amplifier is zeroed using a high impedance FET operational amplifier U3A which at switch on has its output connected to its inverting input by the CMOS switch. The amplifier thus acts as a voltage follower and its inverting input assumes the voltage of its non-inverting input. As a result one plate of the capacitor C9 is held at 3U5 and the other plate is held at a potential determined by the offset of the summing amplifier. When the CMOS switches open, the capacitor C9 holds the offset voltage and the amplifier U3A operates as an inverting amplifier with a gain of 10 due to resistors R20 and R21. Capacitor C10 acts to remove any low frequency interference which may appear at the output of the summing amplifier.

The output of the amplifier U3A is utilized to enable the LED display when approaching a stud or batten. The LED display is a simple window detector which corresponds closely with that shown in FIG. 2. Specifically, resistors R26, R25, R24, R23, R29, R30, R31, R27, R28 of FIG. 7 correspond to, respectively, resistors R15, R16, R17, R18, R23, R21, R22, R14, R20 of FIG. 2. In addition, amplifiers U1A and U1D, and capacitor C3 of FIG. 7 correspond to, respectively, amplifiers A8 and A9, and capacitor C9 of FIG. 2.

Figure 8:
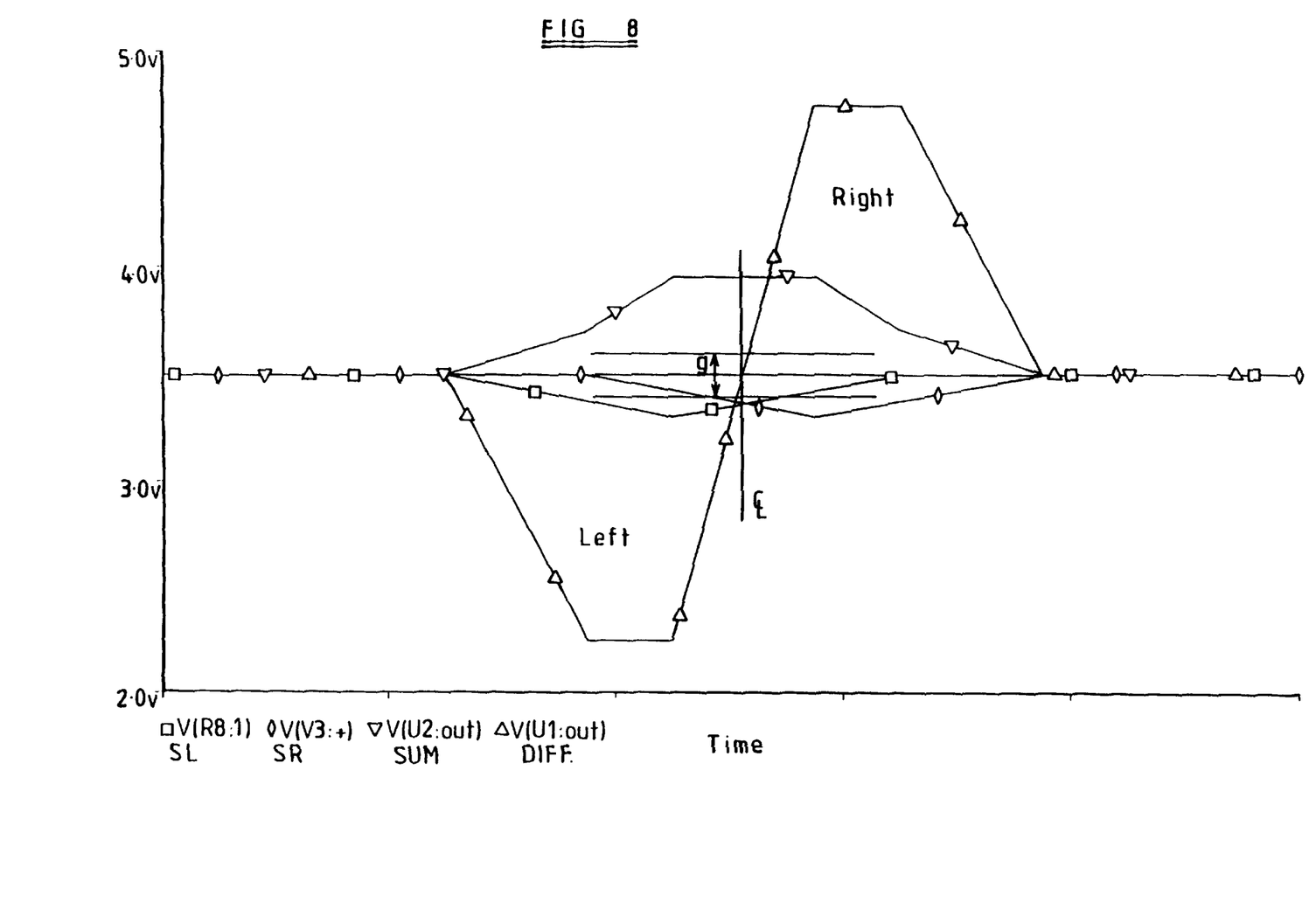
FIG. 8 is a graph similar to that of FIG. 4, for the second embodiment of the invention.

FIG. 8 shows the voltage variations which take place as the detector moves towards and beyond a batten. Specifically, FIG. 8 shows variations in the voltage levels of the left plate sensing signal SL, the right plate sensing signal SR, the summing signal SUM and the difference signal DIFF.

Figure 9:
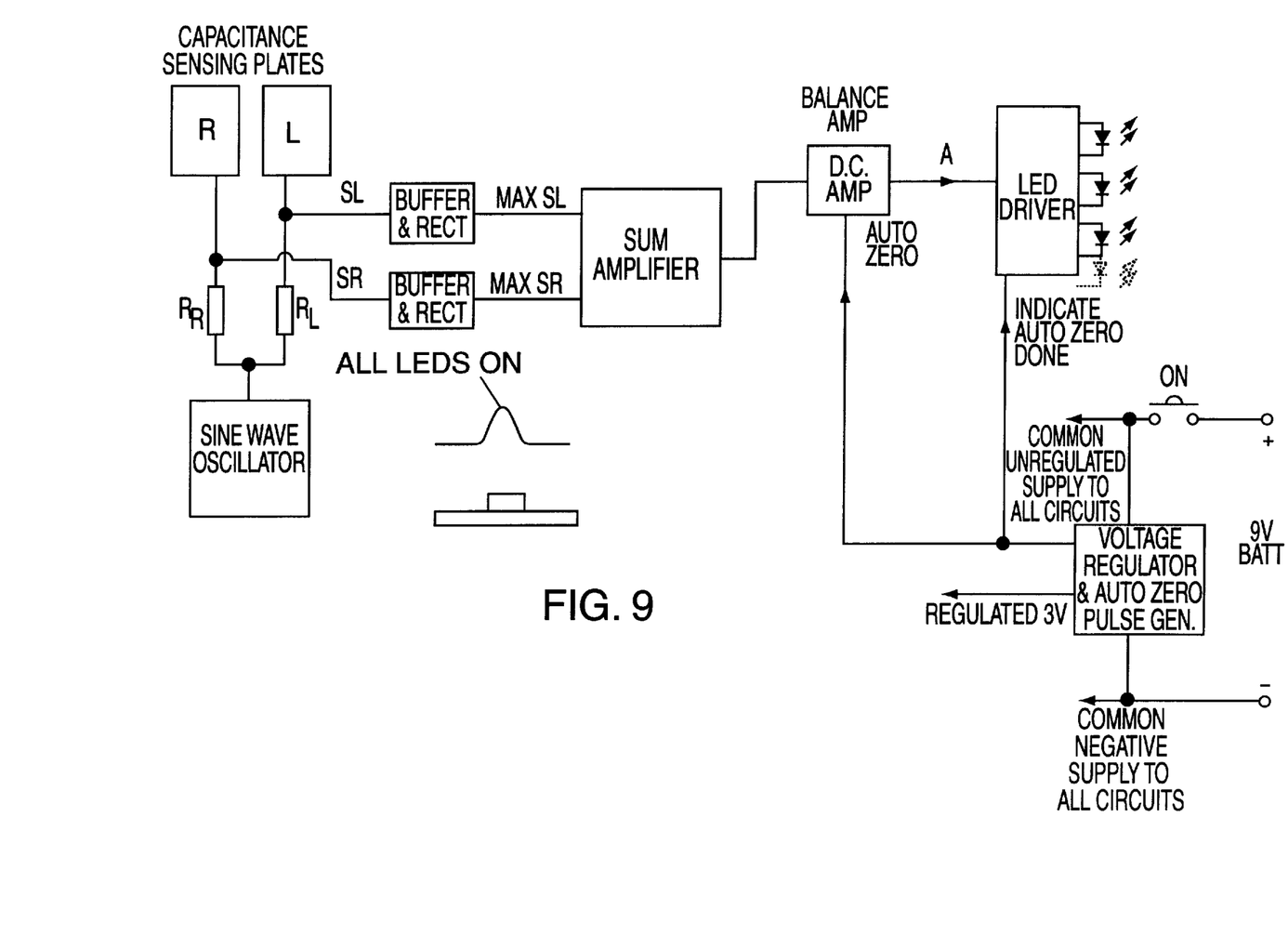
FIGS. 9 and 10 are block diagrams for third and fourth embodiments of the invention respectively, each also including a schematic graph of the type shown in FIG. 4.
Figure 10:
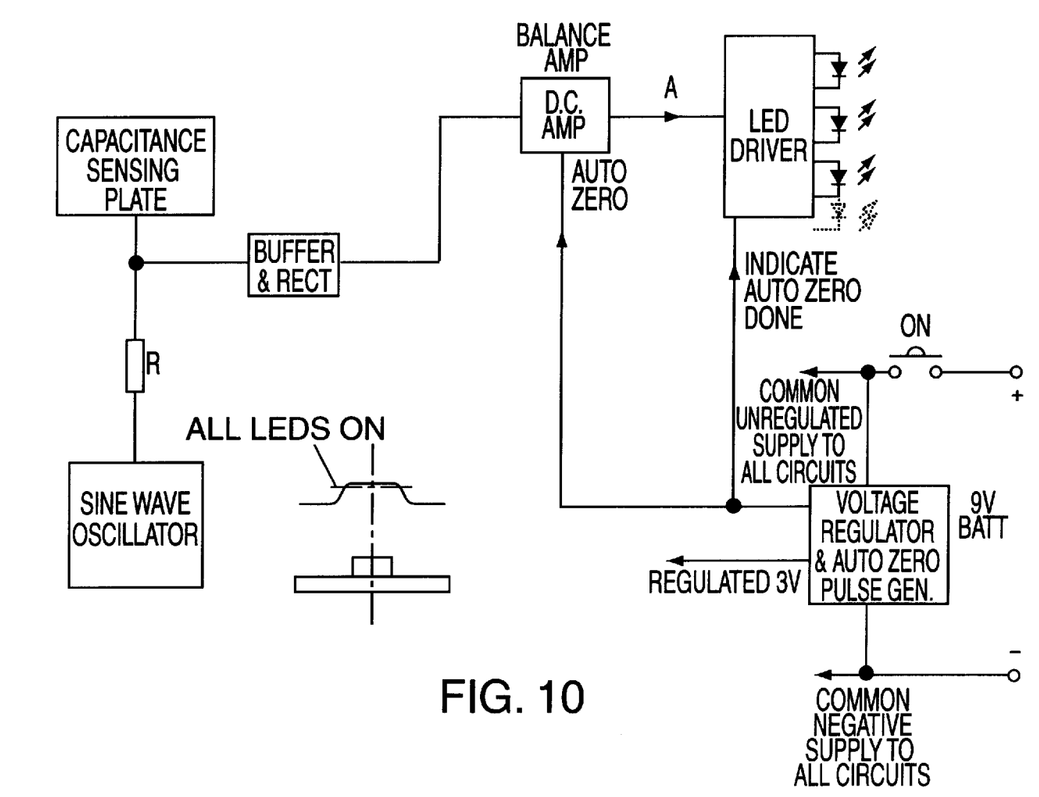

FIGS. 9 and 10 show block diagrams of alternative detectors.

Although the description above refers to studs and battens in partitions, other position detection operations could readily be carried out using an appropriately designed embodiment of the invention.

We claim:

1. A device for detecting the position of a stud in a partition comprising first and second substantially coplanar side-by-side capacitor plates which are electrically isolated from one another, means for applying an alternating signal to said plates through first and second impedance means respectively, so as to produce on said plates alternating voltage signals of amplitude related to the capacitance of each plate, means for producing a first electrical signal related to the sum of such alternating voltage signals, means for producing a second electrical signal related to the difference between such alternating voltage signals and display means including display enabling means operable in accordance with said first electrical signal and balance indicating means operable in accordance with said second electrical signal.

2. A device as claimed in claim 1, in which said display means includes three display devices operating when the display is enabled to indicate respectively (a) when the first capacitor plate has a significantly higher capacitance than the second, (b) when the capacitances of the two plates are substantially equal and (c) when capacitance of the second plate is significantly higher than that of the first.

3. A device as claimed in claim 2, in which said display devices are connected in series with a plurality of resistors between a pair of supply terminals and said display means further comprises a pair of comparators having inputs connected to said difference signal means and to points on a reference resistor chain and outputs connected to points on the series circuit including said display devices so as to cause said display devices to be selectively energised as specified when the display enabling means is operating to enable display.

4. A device as claimed in claim 3, wherein said display enabling means comprises a further comparator having inputs connected to compare the output of said sum signal means with a reference voltage with its output connected to inputs of said pair of comparators and to a switching device for shorting one of the display devices when the sum signal is less than the reference voltage.

5. A device as claimed in claim 4, in which said sum signal means comprises a summing amplifier having inputs connected to said plates and a rectifier circuit connected to the output of said summing amplifier and providing a dc output dependent on the amplitude of the output of said difference amplifier.

6. A device as claimed in claim 5, in which the output of said summing amplifier is connected to said further comparator via an automatic calibration circuit comprising an integrating amplifier ac coupled to said rectifier output and including a feedback capacitor and a calibration switch device connected across said feedback capacitor, said calibration switch device being conductive for an initial period each time the device is actuated.

7. A device as claimed in claim 3, in which said difference signal means comprises a difference amplifier having inputs connected to said plates and a rectifier circuit connected to the output of said difference amplifier and providing a dc output dependent on the amplitude of the output of said difference amplifier.

8. A device as claimed in claim 7, in which the output of said rectifier circuit is connected to said pair of comparators via an automatic calibration circuit comprising a voltage follower having its input connected by a capacitor to the output of said rectifier circuit and via a calibration switch device to a reference voltage source, said calibration switch device being conductive for an initial period each time the device is actuated.

9. A device as claimed in claim 3, in which said difference signal means comprises a difference amplifier having inputs connected to peak detection circuits respectively, said peak detection circuits being supplied with said alternating current signals respectively.

10. A device as claimed in claim 9 including buffer amplifiers through which the alternating current signals are supplied to said peak detection circuits.

11. A device as claimed in claim 3, in which said sum signal means comprises a summing amplifier having inputs connected to peak detection circuits respectively, said peak detection circuits being supplied with said alternating current signals respectively.

12. A device as claimed in claim 10 including buffer amplifiers through which the alternating current signals are supplied to said peak detection circuits.

13. A device for detecting the position of a stud in a partition comprising first and second substantially coplanar side-by-side capacitor plates which are electrically isolated from one another, an oscillator for applying an alternating signal to said plates through first and second resistors respectively, so as to produce on said plates alternating voltage signals of amplitude related to the capacitance of each circuit plate, a summing circuit for producing a first electrical signal related to the sum of such alternating voltage signals, a difference circuit for producing a second electrical signal related to the difference between such alternating voltage signals and a display including a display enabling circuit operable in accordance with said first electrical signal and a balance indicator operable in accordance with said second electrical signal.

* * * * *